(12) United States Patent
Sugimoto

(10) Patent No.: US 9,858,998 B2
(45) Date of Patent: Jan. 2, 2018

(54) SEMICONDUCTOR STORAGE DEVICE AND CONTROL METHOD OF SEMICONDUCTOR STORAGE DEVICE WITH DETECTING LEVELS OF A MULTI-ARY SIGNAL

(71) Applicant: Toshiba Memory Corporation, Minato-ku (JP)

(72) Inventor: Takeshi Sugimoto, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/965,127

(22) Filed: Dec. 10, 2015

(65) Prior Publication Data
US 2017/0069373 A1 Mar. 9, 2017

Related U.S. Application Data

(60) Provisional application No. 62/216,011, filed on Sep. 9, 2015.

(51) Int. Cl.
*G11C 13/00* (2006.01)
*G11C 11/56* (2006.01)

(52) U.S. Cl.
CPC ............ *G11C 13/004* (2013.01); *G11C 11/56* (2013.01); *G11C 13/0002* (2013.01); *G11C 13/0023* (2013.01); *G11C 13/0028* (2013.01); *G11C 13/0061* (2013.01); *G11C 2013/0054* (2013.01); *G11C 2013/0057* (2013.01)

(58) Field of Classification Search
CPC .................................................... G11C 13/004
See application file for complete search history.

(56) References Cited

U.S. PATENT DOCUMENTS

| 5,677,867 A * | 10/1997 | Hazani | G11C 11/5621 |
| | | | 257/E21.682 |
| 7,623,370 B2 | 11/2009 | Toda | |
| 7,903,455 B2 | 3/2011 | Nozawa et al. | |
| 7,989,789 B2 | 8/2011 | Toda | |
| 7,989,794 B2 | 8/2011 | Toda et al. | |
| 8,023,313 B2 | 9/2011 | Toda | |
| 8,456,887 B2 | 6/2013 | Iwata | |
| 8,537,595 B2 | 9/2013 | Toda | |
| 8,559,256 B2 | 10/2013 | Kim | |

FOREIGN PATENT DOCUMENTS

| JP | 2010-55719 | 3/2010 |
| JP | 4660095 | 3/2011 |
| JP | 5065940 | 11/2012 |
| JP | 2012-238369 | 12/2012 |
| JP | 5121439 | 1/2013 |
| WO | WO 03/085675 A2 | 10/2003 |

* cited by examiner

*Primary Examiner* — Harry W Byrne
*Assistant Examiner* — R Lance Reidlinger
(74) *Attorney, Agent, or Firm* — Oblon, McClelland, Maier & Neustadt, L.L.P.

(57) ABSTRACT

According to one embodiment, there is provided a semiconductor storage device including N word lines, M bit lines, multiple memory cells, and a read circuit. N is an integer of four or greater. M is an integer of two or greater. The M bit lines intersect with the word lines. The multiple memory cells are placed at positions where the word lines and the bit lines intersect. The memory cell stores binary data. The read circuit is connected to the M bit lines. The read circuit is able to detect levels of a multi-ary signal.

20 Claims, 14 Drawing Sheets

|  | $B_0$ | $B_1$ | $B_2$ | $B_3$ |
|---|---|---|---|---|
| 1ST TIME | High | High | High | Low |
| 2ND TIME | High | High | Low | High |
| 3RD TIME | High | Low | High | High |

FIG.6

|  | 1ST TIME READ | 2ND TIME READ | 3RD TIME READ |
|---|---|---|---|
| WL1~WL-(p-1) | × | × | × |
| WL-p | ○ | ○ | ○ |
| WL-(p+1)~WL-(q-1) | × | × | × |
| WL-q | ○ | ○ | × |
| WL-(q+1)~WL-(r-1) | × | × | × |
| WL-r | ○ | × | ○ |
| WL-(r+1)~WL-(s-1) | × | × | × |
| WL-s | × | ○ | ○ |
| WL-(s+1)~WL-N | × | × | × |

WL-p: ONE LINE IS ALWAYS SELECTED

WL-q, WL-r, WL-s: TWO LINES ARE SELECTED FROM REMAINING THREE LINES EACH TIME

○: SELECTED
×: NON-SELECTED

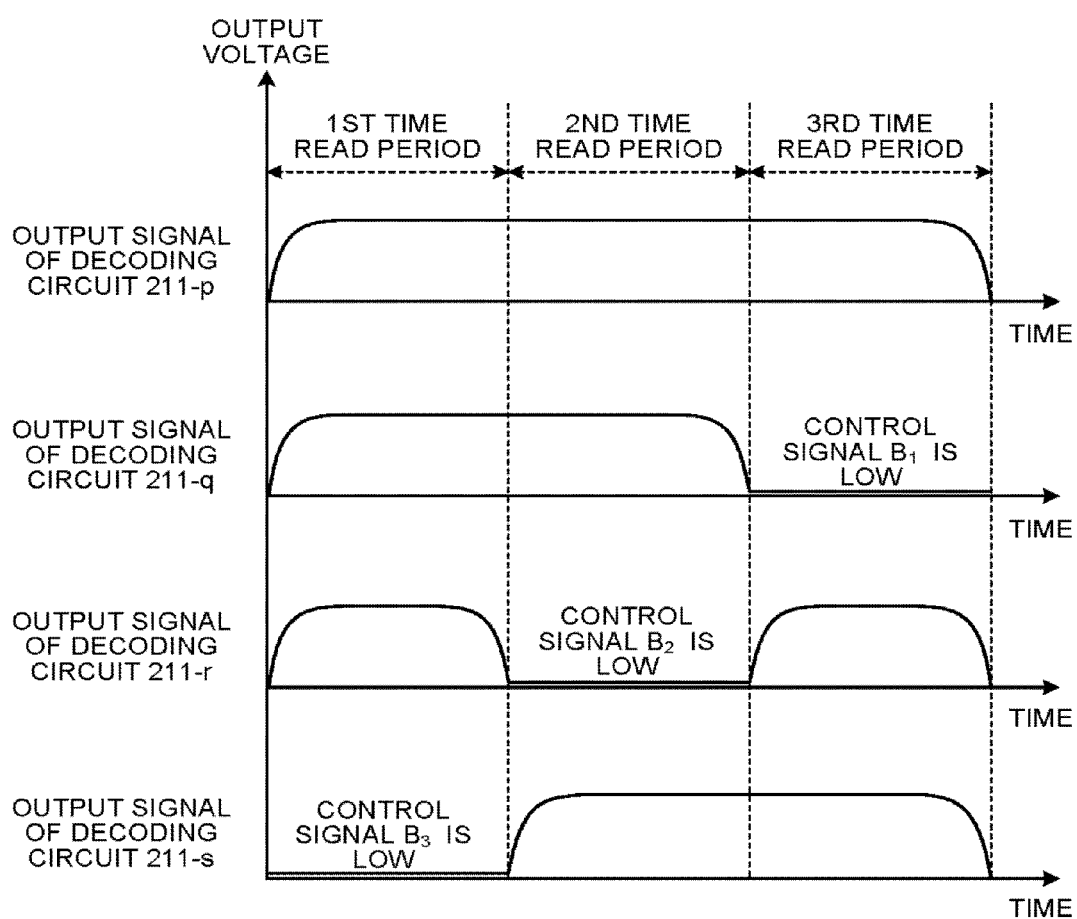

| OUT1 | OUT2 | OUT3 | S/A READ VALUE |
|------|------|------|----------------|
| Low  | Low  | Low  | 0 |
| High | Low  | Low  | 1 |
| High | High | Low  | 2 |
| High | High | High | 3 |

FIG.9

| S/A READ VALUE | | | STATE OF CELL ON SELECTED BL LOW RESISTANCE CELL HOLDS 1 HIGH RESISTANCE CELL HOLDS 0 | | | |
| --- | --- | --- | --- | --- | --- | --- |
| 1ST TIME | 2ND TIME | 3RD TIME | MC (p, k) | MC (q, k) | MC (r, k) | MC (s, k) |
| 0 | 0 | 0 | 0 | 0 | 0 | 0 |
| 0 | 1 | 1 | 0 | 0 | 0 | 1 |
| 1 | 0 | 1 | 0 | 0 | 1 | 0 |
| 1 | 1 | 0 | 0 | 1 | 0 | 0 |
| 1 | 1 | 1 | 1 | 0 | 0 | 0 |
| 1 | 1 | 2 | 0 | 0 | 1 | 1 |
| 2 | 1 | 1 | 0 | 1 | 1 | 0 |
| 1 | 2 | 1 | 0 | 1 | 0 | 1 |
| 2 | 2 | 1 | 1 | 1 | 0 | 0 |
| 2 | 1 | 2 | 1 | 0 | 1 | 0 |
| 1 | 2 | 2 | 1 | 0 | 0 | 1 |
| 2 | 2 | 2 | 0 | 1 | 1 | 1 |
| 2 | 2 | 3 | 1 | 0 | 1 | 1 |
| 2 | 3 | 2 | 1 | 1 | 0 | 1 |
| 3 | 2 | 2 | 1 | 1 | 1 | 0 |
| 3 | 3 | 3 | 1 | 1 | 1 | 1 |

FIG. 11

| S/A READ VALUE | | | | | STATE OF CELL ON 1 SELECTED BL<br>LOW RESISTANCE CELL HOLDS 1<br>HIGH RESISTANCE CELL HOLDS 0 | | | | |
|---|---|---|---|---|---|---|---|---|---|
| 1ST TIME | | | 2ND TIME | | 3RD TIME | OUT_a | OUT_b | OUT_c | OUT_d |
| x | | | y | | z | | | | | |
| 0 | | | 0 | | 0 | 0 | 0 | 0 | 0 | LG-1 |
| 0 | 0 | 0 | 0 | 0 | 0 | 0 | 0 | 0 | | |
| 0 | | | 1 | | 1 | 0 | 0 | 0 | 1 | LG-2 |
| 0 | 0 | 0 | 1 | 0 | 0 | 1 | 0 | 0 | | |
| 1 | | | 0 | | 1 | 0 | 0 | 1 | 0 | |
| 1 | 0 | 0 | 0 | 0 | 0 | 1 | 0 | 0 | | |
| 1 | | | 1 | | 0 | 0 | 1 | 0 | 0 | |
| 1 | 0 | 0 | 1 | 0 | 0 | 0 | 0 | 0 | | |
| 1 | | | 1 | | 1 | 1 | 0 | 0 | 0 | |
| 1 | 0 | 0 | 1 | 0 | 0 | 1 | 0 | 0 | | |
| 1 | | | 1 | | 2 | 0 | 0 | 1 | 1 | |
| 1 | 0 | 0 | 1 | 0 | 0 | 1 | 1 | 0 | | |
| 2 | | | 1 | | 1 | 0 | 1 | 1 | 0 | |
| 1 | 1 | 0 | 1 | 0 | 0 | 1 | 0 | 0 | | |
| 1 | | | 2 | | 1 | 0 | 1 | 0 | 1 | |
| 1 | 0 | 0 | 1 | 1 | 0 | 1 | 0 | 0 | | |
| 2 | | | 2 | | 1 | 1 | 1 | 0 | 0 | |
| 1 | 1 | 0 | 1 | 1 | 0 | 1 | 0 | 0 | | |
| 2 | | | 1 | | 2 | 1 | 0 | 1 | 0 | |
| 1 | 1 | 0 | 1 | 0 | 0 | 1 | 1 | 0 | | |
| 1 | | | 2 | | 2 | 1 | 0 | 0 | 1 | |
| 1 | 0 | 0 | 1 | 1 | 0 | 1 | 1 | 0 | | |
| 2 | | | 2 | | 2 | 0 | 1 | 1 | 1 | |
| 1 | 1 | 0 | 1 | 1 | 0 | 1 | 1 | 0 | | |
| 2 | | | 2 | | 3 | 1 | 0 | 1 | 1 | |
| 1 | 1 | 0 | 1 | 1 | 0 | 1 | 1 | 1 | | |
| 2 | | | 3 | | 2 | 1 | 1 | 0 | 1 | |
| 1 | 1 | 0 | 1 | 1 | 1 | 1 | 1 | 0 | | |
| 3 | | | 2 | | 2 | 1 | 1 | 1 | 0 | |
| 1 | 1 | 1 | 1 | 1 | 0 | 1 | 1 | 0 | | |
| 3 | | | 3 | | 3 | 1 | 1 | 1 | 1 | LG-16 |
| 1 | 1 | 1 | 1 | 1 | 1 | 1 | 1 | 1 | | |

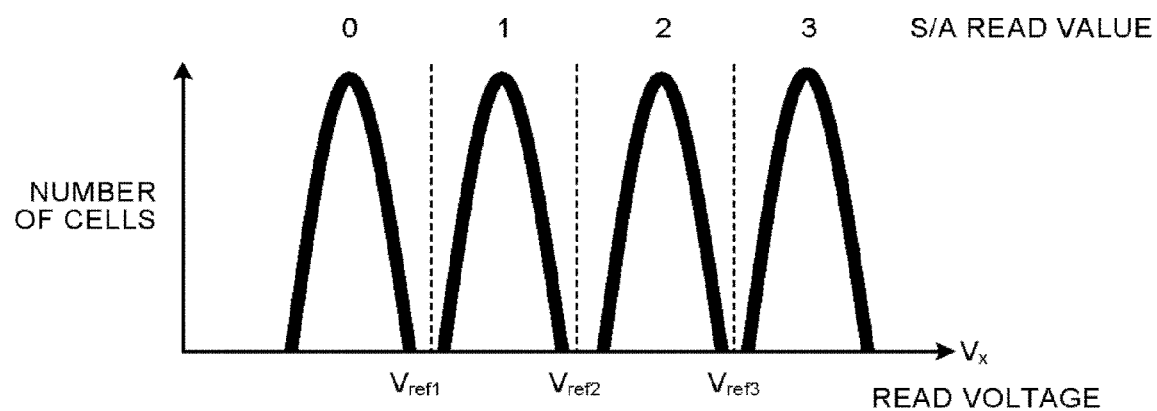

SEMICONDUCTOR STORAGE DEVICE AND CONTROL METHOD OF SEMICONDUCTOR STORAGE DEVICE WITH DETECTING LEVELS OF A MULTI-ARY SIGNAL

CROSS-REFERENCE TO RELATED APPLICATIONS

This application is based upon and claims the benefit of priority from U.S. Provisional Application No. 62/216,011, filed on Sep. 9, 2015; the entire contents of which are incorporated herein by reference.

FIELD

Embodiments described herein relate generally to a semiconductor storage device and a control method of the semiconductor storage device.

BACKGROUND

In cross-point-type semiconductor storage devices such as ReRAMs, memory cells are placed at positions where word lines and bit lines intersect. In the semiconductor storage device, the word line and bit line corresponding to a to-be-selected memory cell are selected, and a current output from the memory cell via the bit line is detected in signal level. In this case, it is desired to reduce the power consumption of the semiconductor storage device.

BRIEF DESCRIPTION OF THE DRAWINGS

FIG. 6 is a diagram showing the operation of a row decoder in the embodiment;

FIG. 7 is a waveform diagram showing the operation of the decoding circuit in the embodiment;

FIG. 9 is a diagram showing the relation between read values from the sense amplifier and values stored in memory cells in the embodiment;

FIG. 11 is a diagram showing the operation of the data recovery circuit in the embodiment;

FIG. 14A is a graph showing the sense levels of the sense amplifier in the modified example of the embodiment; and FIG. 14B is a diagram showing the operation of the sense amplifier in the modified example of the embodiment.

DETAILED DESCRIPTION

In general, according to one embodiment, there is provided a semiconductor storage device including N word lines, M bit lines, multiple memory cells, and a read circuit. N is an integer of four or greater. M is an integer of two or greater. The M bit lines intersect with the word lines. The multiple memory cells are placed at positions where the word lines and the bit lines intersect. The memory cell stores binary data. The read circuit is connected to the M bit lines. The read circuit is able to detect levels of a multi-ary signal.

Exemplary embodiments of a semiconductor storage device will be explained below in detail with reference to the accompanying drawings. The present invention is not limited to the following embodiments.

Embodiment

Figure 1:
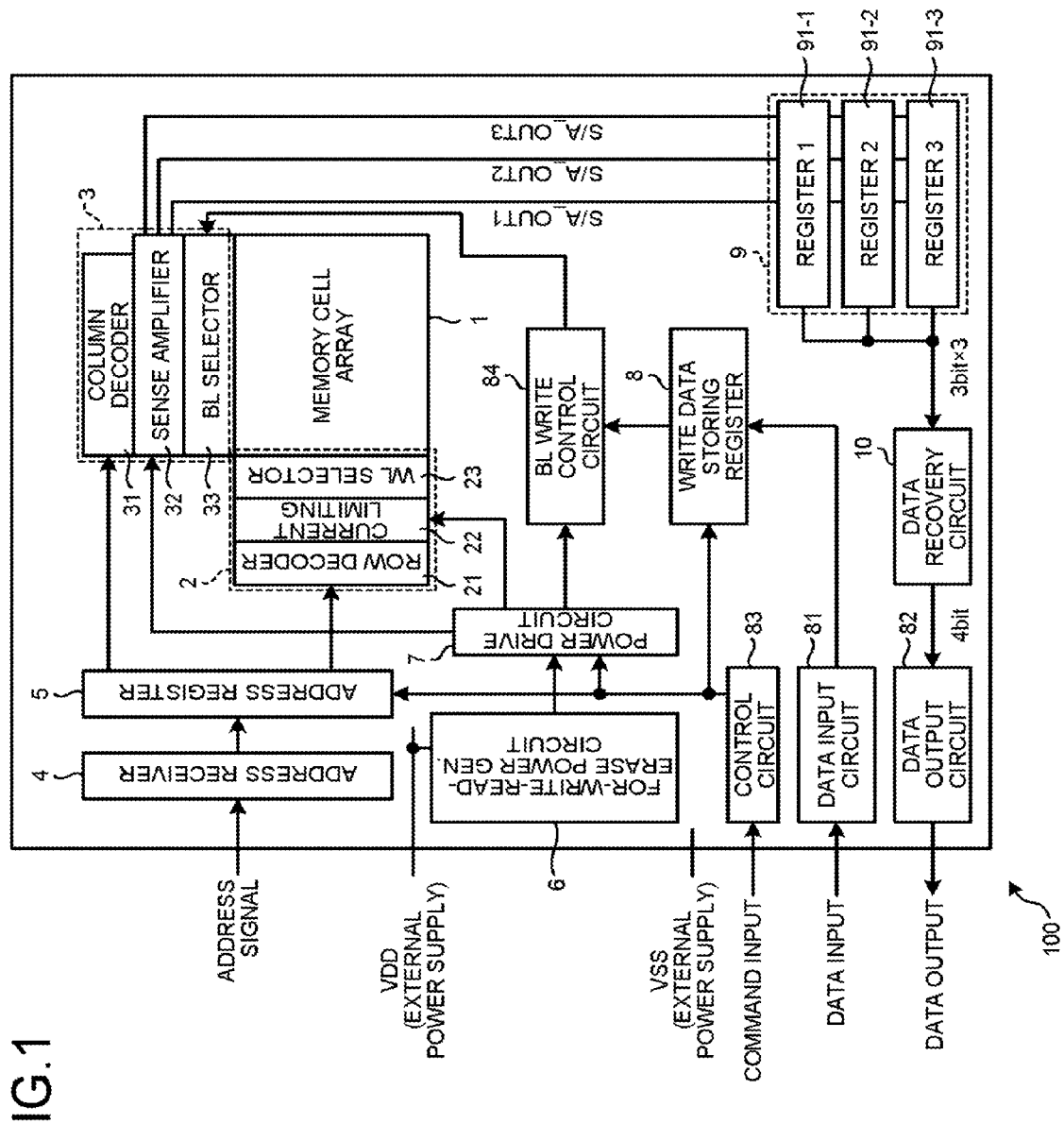
FIG. 1 is a block diagram showing the configuration of a semiconductor storage device according to an embodiment.
Figure 2:
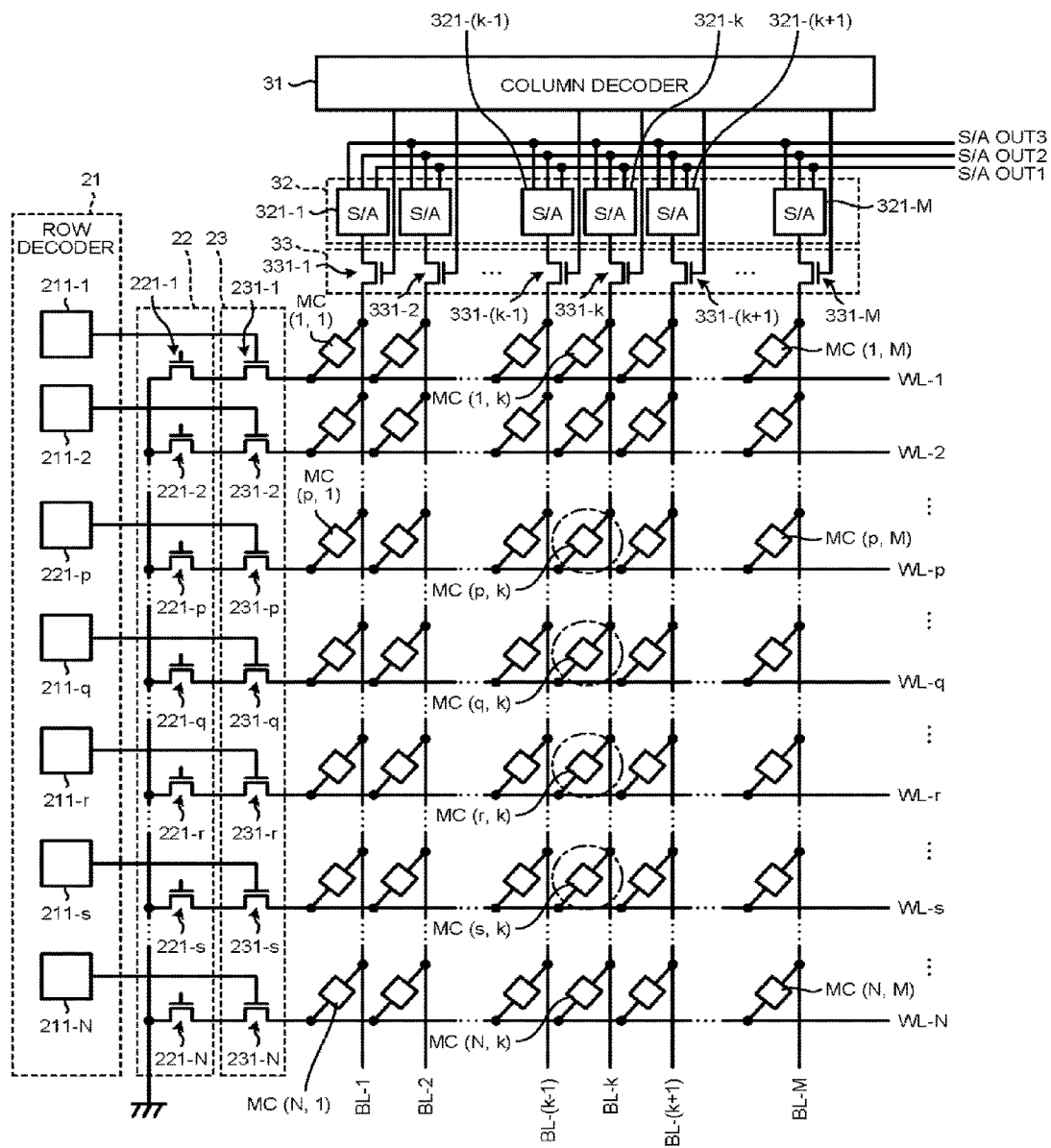
FIG. 2 is a circuit diagram showing the configuration of a memory cell array in the embodiment.
Figure 3:
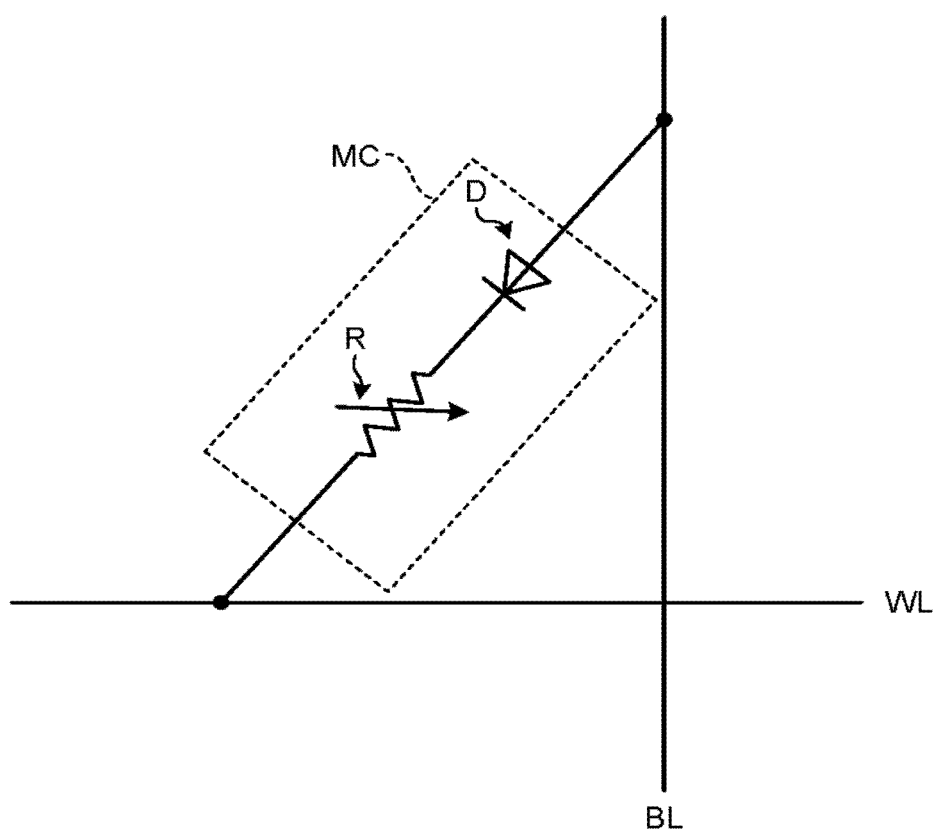
FIG. 3 is a circuit diagram showing the configuration of a memory cell in the embodiment.

A semiconductor storage device 100 according to the embodiment will be described using FIGS. 1 to 3. FIG. 1 is a diagram showing the configuration of the semiconductor storage device 100. FIG. 2 is a diagram showing the configuration of a memory cell array 1. FIG. 3 is a circuit diagram showing the configuration of a memory cell MC.

The semiconductor storage device 100 has the memory cell array 1, N number of word lines WL-1 to WL-N, a row-related circuit (control circuit) 2, M number of bit lines BL-1 to BL-M, a column-related circuit (read circuit) 3, an address receiver 4, an address register 5, a power generation circuit 6 for write/read/erase operation, a power drive circuit 7, a control circuit 83, a write data storing register 8, a bit line (BL) write control circuit 84, a hold circuit 9, a data recovery circuit 10, a data input circuit 81, and a data output circuit 82, where N is an integer of four or greater and M is an integer of two or greater.

In the memory cell array 1, as shown in FIG. 2, multiple memory cells MC(1,1) to MC(N,M) are arranged. For example, the multiple memory cells MC(1,1) to MC(N,M) are arranged two-dimensionally at positions where N word lines WL-1 to WL-N and M bit lines BL-1 to BL-M intersect. In the memory cell array 1, by laying two-dimensional arrangements (memory layers) of memory cells MC one over another, a three-dimensional arrangement of memory cells MC may be realized.

As shown in FIG. 3, in a memory cell MC placed at the position where a word line WL and a bit line BL intersect, a rectifier element D and a variable resistance element R are connected in series. The rectifier element D is, for example, a diode, and its cathode is connected to the variable resistance element R and its anode is connected to the bit line BL. The variable resistance element R is connected at one end to the word line WL, and the other end is connected to the rectifier element D.

The variable resistance element R is an element that transitions between two resistance value states, e.g., a low resistance state and a high resistance state. For example, when a specified set voltage is applied across the both ends of the memory cell MC so that the diode D is forward-biased, the variable resistance element R transitions from the high resistance state to the low resistance state (written/set). Further, when a specified reset voltage is applied across the both ends of the memory cell MC so that the diode D is forward-biased, the variable resistance element R transitions from the low resistance state to the high resistance state (erased/reset). Thus, each memory cell MC can store binary data.

In this way, the semiconductor storage device 100 may be an ReRAM (Resistance Random Access Memory) having a cross-point-type memory cell array 1.

It should be noted that, although FIG. 3 illustrates a configuration where the direction from the bit line BL toward the word line WL is the forward direction of the rectifier element D as the configuration of the memory cell MC, the memory cell may be configured such that the direction from the bit line BL toward the word line WL is the reverse direction of the rectifier element D. Or in each memory cell MC, the rectifier element D and the variable resistance element R may be exchanged in placement.

The address receiver 4 shown in FIG. 1 stores an address signal supplied externally into an address register 5. The control circuit 83 receives a command supplied externally to issue an instruction corresponding to the command to each circuit. The control circuit 83 issues, e.g., an instruction to control the operation voltage, operation timing, and the like in write/read/erase operation. The address register 5 sends an address signal to the row-related circuit 2 and column-related circuit 3 according to the instruction from the control circuit 83.

The data input circuit 81 temporarily stores data (write data) input externally into the write data storing register 8. The write data storing register 8 sends the data to the bit line write control circuit 84 according to the instruction from the control circuit 83. The bit line write control circuit 84 controls a voltage being transferred from the power drive circuit 7.

The data output circuit 82 is connected to an external host (not shown) via external I/O lines and outputs read data to the host, notifies write completion, or notifies erase completion.

The power generation circuit 6 for write/read/erase operation generates power supply voltages for write/read/erase operation respectively to supply to the power drive circuit 7.

The power drive circuit 7 supplies the power supply voltages for write/read/erase operation to the row-related circuit 2 and column-related circuit 3 according to an instruction from the control circuit 83.

The N word lines WL-1 to WL-N shown in FIG. 2 extend in a direction along rows between the multiple memory cells MC(1,1) to MC(N,M).

The row-related circuit 2 shown in FIG. 1 is provided at a position adjacent to the memory cell array 1 in a direction in which the word lines WL extend. The row-related circuit 2 has a row decoder 21, a current limiting block 22, and a word line selector (WL selector) 23. The row decoder 21 receives the address signal from the address register 5 and drives the word lines WL via the word line selector 23 according to the address signal. At this time, the current limiting block 22 limits a current flowing through the selected word line WL so that the value of the current is at a predetermined value.

Correspondingly to the N word lines WL-1 to WL-N, the row decoder 21 has N number of decoding circuits 211-1 to 211-N; the current limiting block 22 has N number of current limiting elements 221-1 to 221-N; and the word line selector 23 has N number of word line drivers 231-1 to 231-N. For example, the decoding circuit 211-*p* selects the word line WL-*p* via the word line driver 231-*p*, and applies voltages necessary to erase data therein, write data into them, and read data from them to selected ones of the memory cells MC(p,1) to MC(p,M) of the pth row. Each current limiting element 221-1 to 221-N is, for example, an NMOS transistor, and such a bias is supplied to its gate that the transistor operates in a linear region, so that it operates as an active load. Thus, when memory cells MC corresponding to each word line WL are turned on so that currents flow, the currents even for each word line WL can flow.

The M bit lines BL-1 to BL-M shown in FIG. 2 extend in a direction along columns between the multiple memory cells MC(1,1) to MC(N,M).

The column-related circuit 3 shown in FIG. 1 is provided at a position adjacent to the memory cell array 1 in a direction in which the bit lines BL extend. The column-related circuit 3 is connected to the M bit lines BL-1 to BL-M.

For example, the column-related circuit 3 has a column decoder 31, a sense amplifier block 32, and a bit line selector (BL selector) 33. The column decoder 31 receives the address signal from the address register 5 and selects a bit line BL via the bit line selector 33 according to the address signal.

Correspondingly to the M bit lines BL-1 to BL-M, the sense amplifier block 32 has M sense amplifiers (S/A) 321-1 to 321-M, and the bit line selector 33 has M bit line drivers 331-1 to 331-M. For example, the column decoder 31 selects the bit line BL-*k* via the bit line driver 331-*k* and erases data therein, writes data into them, and reads data from them for selected ones of the memory cells MC(1,k) to MC(N,k) of the kth column. Further, the column decoder 31 amplifies read data by the sense amplifiers 321 so as to be output to the hold circuit 9. Each sense amplifier 321 outputs the detecting result to the hold circuit 9.

In the semiconductor storage device 100, one bit line BL and one word line WL may be selected so as to read information in the memory cell MC located at the position where the two intersect. For example, cell information is read by sensing (detecting) the magnitude of current flowing through the variable resistance element R in the memory cell array 1 by the sense amplifier 321. If cell integration in the memory cell array 1 is improved, word lines WL/bit lines BL become high in resistance, so that voltage drops across the word lines WL/bit lines BL are likely to occur. As a result, a desired voltage may not be applied to the selected memory cell MC, and the bit value stored in the selected memory cell MC may not be able to be read correctly.

For example, it can be thought that in order to avoid the word lines WL/bit lines BL becoming high in resistance (that is, to shorten the lengths of the word lines WL/bit lines BL), the memory cell array 1 is divided into multiple sub-memory cell arrays, which are arranged in a chip. In this case, if the array is divided into sub-memory cell arrays to increase the number of bits to be read at a time, the number of cells from which to read in one sub-memory cell array decreases. As a result, the number of sub-memory cell arrays to drive needs to be increased, so that the consumption current of the semiconductor storage device 100 may increase.

Further, if, without dividing into sub-memory cell arrays, one bit line BL and one word line WL are selected so as to read information in the memory cell MC located at the position where the two intersect, then an equal number of times of read operation to the number of memory cells from which to read binary information are needed. Thus, as the number of memory cells from which to read information increases, the number of times of read processing increases, so that the consumption current of the semiconductor storage device 100 tends toward increasing.

Thus, in the present embodiment, in the semiconductor storage device 100, the number of times of read processing is reduced with respect to the number of memory cells from which to read binary information so as to reduce the consumption current of the semiconductor storage device 100 by configuring the column-related circuit 3 to be able to detect the levels of a multi-ary signal and implementing tactics in read processing as follows.

Specifically, letting K be an integer of three or greater that is smaller than N, the row-related circuit 2 determines (K+1) word lines WL from among the N word lines WL to be candidates for selection. The N word lines WL may include multiple sets of (K+1) word lines WL as candidates for selection. The row-related circuit 2 performs selection operation to select K word lines WL from among the (K+1) word lines WL as candidates for selection K times while the non-selected word line WL is different for the K times. In each of K times of selection operation, one word line WL of the (K+1) word lines WL is selected fixedly while (K−1) word lines are selected from among the remaining K word lines WL.

The column-related circuit 3 selects one bit line BL. With the one bit line BL being selected, the column-related circuit 3 detects the level of a signal output from K selected memory cells in each of K times of selection operation. The column-related circuit 3 can detect the level of a K-ary signal. In each of K times of selection operation, the column-related circuit determines (K+1) memory cells MC corresponding to word lines WL as candidates for selection to be candidates for selection and detects the level of a signal output from K memory cells MC, which are selected from among the (K+1) memory cells MC as candidates for selection while the non-selected memory cell MC is different for the K times.

That is, the column-related circuit 3 sets the one bit line (selected bit line) BL to be at a selecting potential (e.g., a power supply potential) while the K selected word lines WL are set to be at a selecting potential (e.g., ground potential). Thus, currents do not flow through memory cells MC in the high resistance state from among the K memory cells MC while currents flow through memory cells MC in the low resistance state. Letting the low resistance state of the memory cell MC be the state where a bit of "1" is written and the high resistance state be the state where a bit of "0" is written, the current flowing through the selected bit line BL takes on the sum of currents flowing through memory cells MC into which a bit of "1" is written. Thus, the semiconductor storage device 100 can find out into how many memory cells MC from among the K memory cells MC a bit of "1" is written by the column-related circuit 3 detecting the level of the current flowing through the selected bit line BL. Then the memory bits of the (K+1) memory cells MC as candidates for selection can be identified from the sense results of K times of selection operation because, from among the (K+1) memory cells MC as candidates for selection, the non-selected memory cell MC is different for the K times. That is, the number of times of read processing is reduced to K with respect to the number (K+1) of memory cells from which to read binary information.

For example, the row decoder 21 of the row-related circuit 2 has the N decoding circuits 211-1 to 211-N. Where the N word lines WL include multiple sets of (K+1) word lines WL as candidates for selection, the N decoding circuits 211-1 to 211-N include multiple sets of (K+1) decoding circuits 211 corresponding to the (K+1) word lines WL as candidates for selection. The (K+1) decoding circuits 211 of each set can receive control signals that are the same for each decoding circuit 211 (e.g., control signals $B_0$ to $B_3$ shown in FIG. 4A). Control signals received by the decoding circuit 211 may be different between different sets.

Figures 4A, 4B:
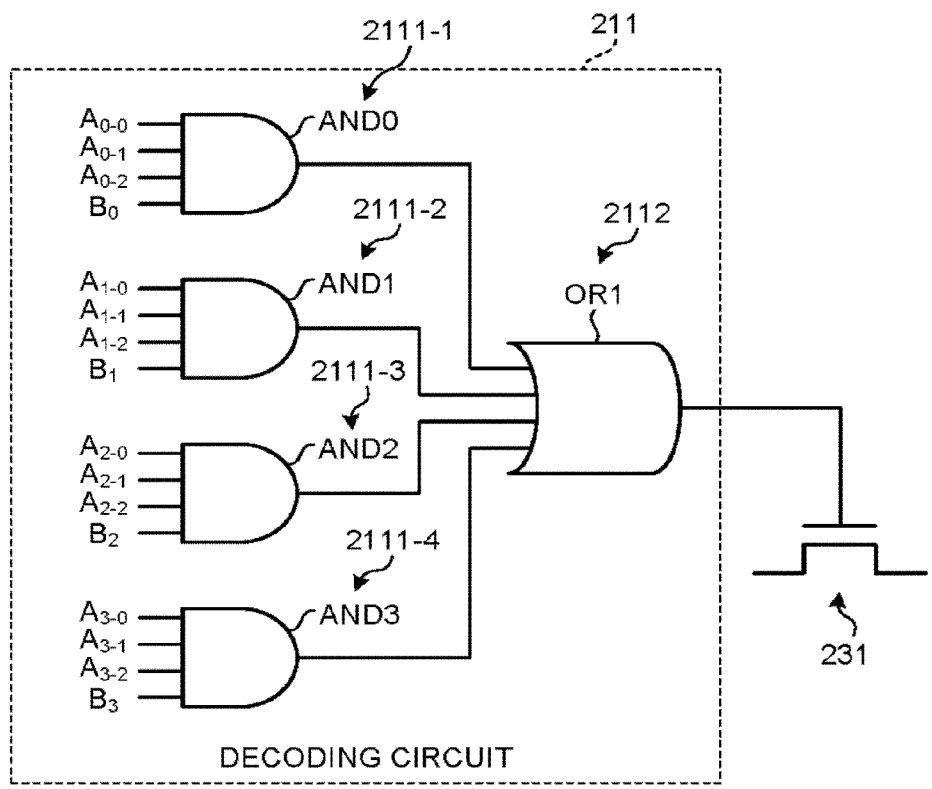
FIG. 4A is a circuit diagram showing the configuration of a decoding circuit in the embodiment.
FIG. 4B is a diagram showing control signals supplied to the decoding circuit in the embodiment.

Each decoding circuit 211 has (K+1) sub-decoding circuits 2111-1 to 2111-(K+1) and a combining circuit 2112. For example, where K=3, the decoding circuit 211 has the configuration shown in FIG. 4A. FIG. 4A is a diagram showing the configuration of the decoding circuit 211. The decoding circuit 211 has four sub-decoding circuits 2111-1 to 2111-4 and a combining circuit 2112. The sub-decoding circuit 2111-1 has a logical product operator AND0. The logical product operator AND0 computes the logical product of address signals $A_{0-0}$ to $A_{0-2}$ and the control signal $B_0$ to supply the operation result to the combining circuit 2112. The sub-decoding circuit 2111-2 has a logical product operator AND1. The logical product operator AND1 computes the logical product of address signals $A_{1-0}$ to $A_{1-2}$ and the control signal $B_1$ to supply the operation result to the combining circuit 2112. The sub-decoding circuit 2111-3 has a logical product operator AND2. The logical product operator AND2 computes the logical product of address signals $A_{2-0}$ to $A_{2-2}$ and the control signal $B_2$ to supply the operation result to the combining circuit 2112. The sub-decoding circuit 2111-4 has a logical product operator AND3. The logical product operator AND3 computes the logical product of address signals $A_{3-0}$ to $A_{3-2}$ and the control signal $B_3$ to supply the operation result to the combining circuit 2112. The combining circuit 2112 has a logical sum operator OR1. The logical sum operator OR1 computes the logical sum of the operation results of the logical product operators AND0 to AND3 to supply the operation result as an output signal to the gate of a word line driver 231.

The sense amplifier block 32 of the column-related circuit 3 has M sense amplifiers 321-1 to 321-M. Each sense amplifier 321 is configured to be able to detect the levels of a multi-ary signal corresponding to the value of the current flowing through the selected bit line BL. Where the row-related circuit 2 performs selection operation of K word lines WL from among the (K+1) word lines WL as candidates for selection K times while the non-selected word line WL is different for the K times, the sense amplifier block 32 is configured to be able to detect the levels of a (K+1)-ary signal.

Figure 5:
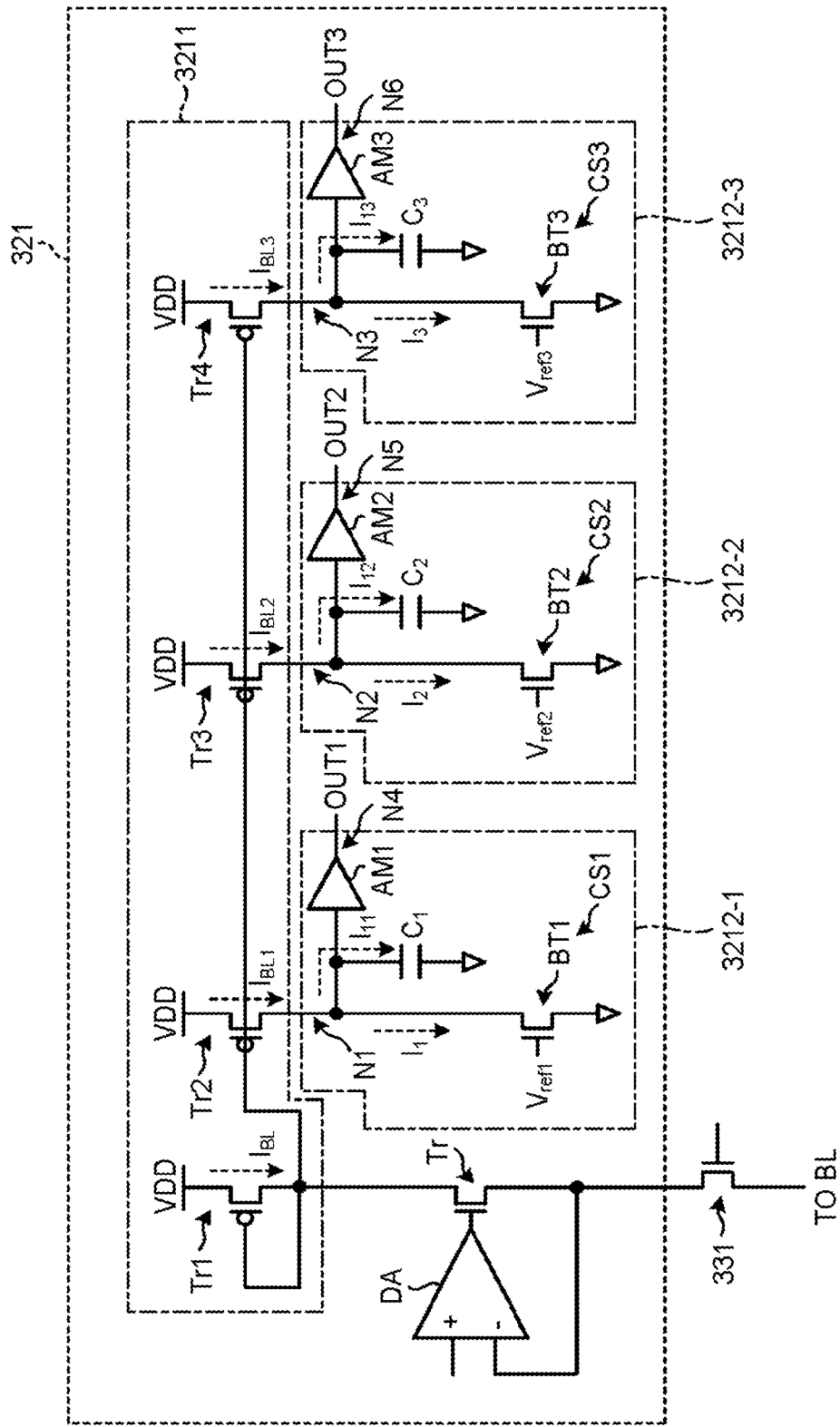
FIG. 5 is a circuit diagram showing the configuration of a sense amplifier in the embodiment.

Each sense amplifier 321 has a current mirror circuit group 3211 and K detection circuits 3212-1 to 3212-K. The K detection circuits 3212-1 to 3212-K have current sources and are configured to detect different signal levels by making the drive capabilities of the current sources different so as to make the levels of voltages on charged input nodes different. For example, where K=3, the sense amplifier 321 has the configuration shown in FIG. 5. FIG. 5 is a diagram showing the configuration of the sense amplifier 321. The sense amplifier 321 has a current mirror circuit group 3211 and three detection circuits 3212-1 to 3212-3. The current mirror circuit group 3211 is connected to a bit line BL via a load transistor Tr and a bit line driver 331. The three detection circuits 3212-1 to 3212-3 are connected to the current mirror circuit group 3211. The three detection circuits 3212-1 to 3212-3 can detect different signal levels according to the current received from the current mirror circuit group 3211.

The current mirror circuit group 3211 has load transistors Tr1 to Tr4. A pair of load transistors Tr1 and Tr2, a pair of load transistors Tr1 and Tr3, and a pair of load transistors Tr1 and Tr4 each constitute a current mirror circuit. Currents $I_{BL1}$, $I_{BL2}$, $I_{BL3}$ proportional to a bit line current $I_{BL}$, according to their mirror ratio, flow through the load transistors Tr2 to Tr4 respectively.

The three detection circuits 3212-1 to 3212-3 have input nodes N1 to N3, capacitance elements C1 to C3, current sources CS1 to CS3, amplifiers AM1 to AM3, and output nodes N4 to N6. The input nodes N1 to N3 are connected to the current mirror circuit group 3211, and currents $I_{BL1}$, $I_{BL2}$, $I_{BL3}$ flow from the current mirror circuit group 3211 through them. The capacitance elements C1 to C3 are connected at their one end to the input nodes N1 to N3 and connected to the output nodes N4 to N6 via the amplifiers AM1 to AM3. The capacitance elements C1 to C3 are connected at their other end to a reference potential (e.g., ground potential). The current sources CS1 to CS3 are connected between the input nodes N1 to N3 and the reference potential (e.g., ground potential).

The capacitance values of the capacitance elements C1 to C3 are substantially even between the three detection circuits 3212-1 to 3212-3, and the drive capabilities of the current sources CS1 to CS3 are different. The current sources CS1 to CS3 have bias transistors BT1 to BT3. The bias transistors BT1 to BT3 have dimensions even for them, for example. Reference voltages Vref1, Vref2, Vref3 are supplied as bias to the gates of the bias transistors BT1 to BT3. If the magnitude relation between the reference voltages is given by:

$$Vref1 < Vref2 < Vref3,$$

then the magnitude relation between currents I1 to I3 sunk by the current sources CS1 to CS3 is given by:

$$I1 < I2 < I3,$$

and thus the magnitude relation between currents I11 to I13 flowing through one ends of the capacitance elements C1 to C3 is given by:

$$I11 > I12 > I13.$$

Hence, because voltages on the three charged capacitance elements C1 to C3 can be different according to the level of the current $I_{BL}$ flowing through the bit line BL, the levels of a four-ary signal can be detected.

The operation of reading a signal from the memory cell MC in the case where K=3 will be described using FIG. 6. Where K=3, three times of selection operation (read operation) are performed. In the case of FIG. 6, four word lines WL-p, WL-q, WL-r, WL-s from among N word lines WL are determined to be candidates for selection. The row-related circuit 2 performs selection operation of three word lines WL from among the four word lines WL-p, WL-q, WL-r, WL-s as candidates for selection three times while the non-selected word line WL is different for the three times. In each of three times of selection operation, one word line WL of the four word lines WL is selected fixedly while two word lines WL are selected from among the remaining three word lines WL. The word line WL-p is selected fixedly from among the four word lines WL-p, WL-q, WL-r, WL-s as candidates for selection while two word lines WL are selected from among the remaining three word lines WL-q, WL-r, WL-s.

In the first time of selection operation (read operation), the word line WL-s is non-selected from among the word lines WL-p, WL-q, WL-r, WL-s as candidates for selection. That is, the address signals $A_{0-0}$ to $A_{3-2}$ are rendered active in level simultaneously for decoding circuits 211-p, 211-q, 211-r, 211-s as candidates for selection. At this time, as shown in FIG. 4B, the control signal $B_3$ is rendered non-active (low) in level from among the control signals $B_0$ to $B_3$ to switch the non-selected. FIG. 4B is a diagram showing the control signals supplied to the decoding circuit 211. Thus, as shown in FIG. 7, the decoding circuit 211-s outputs a signal of a non-active level (low level) while the other decoding circuits 211-p, 211-q, 211-r output a signal of an active level (high level). FIG. 7 is a waveform diagram showing the operation of the decoding circuit 211. According to this, the word line driver 231-s is maintained in an off state while the word line drivers 231-p, 231-q, 231-r are maintained in an on state. As a result, a non-selecting potential (high impedance) is set on the word line WL-s while a selecting potential (ground potential) is set on the word lines WL-p, WL-q, WL-r. Thus, if the bit line BL-k is selected, the memory cell MC(s,k) from among memory cells MC(p,k), MC(q,k), MC(r,k), MC(s,k) as candidates for selection is determined to be non-selected, and the memory cells MC(p,k), MC(q,k), MC(r,k) are selected.

Likewise, in the second time of selection operation (read operation), the word line WL-r is non-selected from among the word lines WL-p, WL-q, WL-r, WL-s as candidates for selection. That is, the non-selecting potential (high impedance) is set on the word line WL-r while the selecting potential (ground potential) is set on the word lines WL-p, WL-q, WL-s. Thus, if the bit line BL-k is selected, the memory cell MC(r,k) from among memory cells MC(p,k), MC(q,k), MC(r,k), MC(s,k) as candidates for selection is determined to be non-selected, and the memory cells MC(p,k), MC(q,k), MC(s,k) are selected.

In the third time of selection operation (read operation), the word line WL-q is non-selected from among the word lines WL-p, WL-q, WL-r, WL-s as candidates for selection. That is, the non-selecting potential (high impedance) is set on the word line WL-q while the selecting potential (ground potential) is set on the word lines WL-p, WL-r, WL-s. Thus, if the bit line BL-k is selected, the memory cell MC(q,k) from among memory cells MC(p,k), MC(q,k), MC(r,k), MC(s,k) as candidates for selection is determined to be non-selected, and the memory cells MC(p,k), MC(r,k), MC(s,k) are selected.

Figures 8A, 8B:
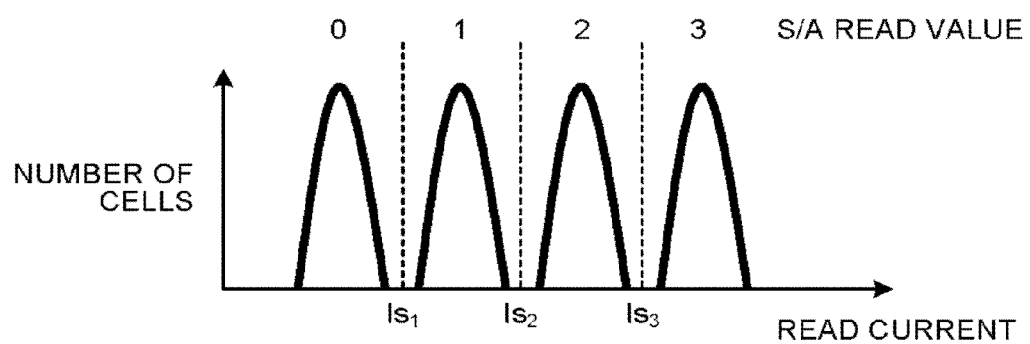
FIG. 8A is a graph showing the sense levels of the sense amplifier in the embodiment.
FIG. 8B is a diagram showing the operation of the sense amplifier in the embodiment.

At this time, the sense amplifier 321-k in the sense amplifier block 32 corresponding to the bit line BL-k detects the level of a (K+1)-ary signal. For example, where K=3, each sense amplifier 321 in the sense amplifier block 32 detects the level of a four-ary signal as shown in FIGS. 8A and 8B. FIG. 8A is a graph showing the sense levels of the sense amplifier 321. FIG. SB is a diagram showing the operation of the sense amplifier 321.

For example, if a bit of "0" is written into each of the three selected memory cells MC, so that all the three memory cells MC are off, then the level of the current $I_{BL}$ flowing through the bit line BL can become smaller than Is1 shown in FIG. 8A. Thus, because all the capacitance elements C1 to C3 shown in FIG. 5 are hardly charged with electric charge, all of output signals OUT1 to OUT3 become the low level as shown in FIG. 8B. At this time, the value read by the sense amplifier 321 is "0", and its bit representation is "000" which corresponds to (OUT1, OUT2, OUT3)=(low, low, low).

If a bit of "1" is written into one of the three selected memory cells MC, and a bit of "0" is written into the remaining two memory cells MC, so that the one memory cell MC is selectively on, then the level of the current $I_{BL}$ flowing through the bit line BL can become greater than or equal to $Is_1$ and smaller than $Is_2$ shown in FIG. 8A. Thus, because the capacitance element C1 shown in FIG. 5 is charged while the capacitance elements C2, C3 are hardly charged with electric charge, the output signal OUT1 becomes the high level, and the output signals OUT2, OUT3 both become the low level as shown in FIG. 8B. At this time, the value read by the sense amplifier 321 is "1", and its bit representation is "100" which corresponds to (OUT1, OUT2, OUT3)=(high, low, low).

If a bit of "1" is written into two of the three selected memory cells MC, and a bit of "0" is written into the remaining one memory cell MC, so that the two memory cells MC are selectively on, then the level of the current $I_{BL}$ flowing through the bit line BL can become greater than or equal to $Is_2$ and smaller than $Is_3$ shown in FIG. 8A. Thus, because the capacitance elements C1, C2 shown in FIG. 5 are charged while the capacitance element C3 is hardly charged with electric charge, the output signals OUT1, OUT2 become the high level, and the output signal OUT3 becomes the low level as shown in FIG. 8B. At this time, the value read by the sense amplifier 321 is "2", and its bit representation is "110" which corresponds to (OUT1, OUT2, OUT3)=(high, high, low).

If a bit of "1" is written into each of the three selected memory cells MC, so that all the three memory cells MC are on, then the level of the current $I_{BL}$ flowing through the bit line BL can become greater than or equal to $Is_3$ shown in FIG. 8A. Thus, because the capacitance elements C1 to C3 shown in FIG. 5 are charged with electric charge, all the output signals OUT1 to OUT3 become the high level as shown in FIG. 8B. At this time, the value read by the sense amplifier 321 is "3", and its bit representation is "111" which corresponds to (OUT1, OUT2, OUT3)=(high, high, high).

As shown in FIG. 9, the semiconductor storage device 100 can identify the memory bits of the four memory cells MC as candidates for selection from the sense results (read values) of three times of selection operation because, from among the four memory cells MC as candidates for selection, the non-selected memory cell MC is different for the three times. FIG. 9 is a diagram showing the relation between the read values from the sense amplifier and the values stored in the memory cells.

For example, if all the read values of the first to third times are "0", then all the stored bits of the four memory cells MC(p,k), MC(q,k), MC(r,k), MC(s,k) can be identified as "0". For example, if the read value of the first time is "0", and the read values of the second and third times are each "1", then the stored bit of the memory cell MC(s,k), which is non-selected in the first time of selection operation, can be identified as "1", and the stored bits of the other memory cells MC(p,k), MC(q,k), MC(r,k) as "0", and so on. For example, if all the read values of the first to third times are "3", then all the stored bits of the four memory cells MC(p,k), MC(q,k), MC(r,k), MC(s,k) can be identified as "1".

The semiconductor storage device 100 further has the hold circuit 9 and the data recovery circuit 10 in order to recover the stored bits of the selected memory cells from the sense results (signal level detecting results) of the sense amplifier block 32. The hold circuit 9 holds the results of detecting the signal level K times. The hold circuit 9 includes K registers 91-1 to 91-K. The K registers 91-1 to 91-K correspond to K times of selection operation. Each register 91-1 to 91-K stores the sense result (read value) of corresponding selection operation from among K times of selection operation. For example, where K=3, the hold circuit 9 includes three registers 91-1 to 91-3 as shown in FIG. 1. The register 91-1 stores the read value of the first time; the register 91-2 stores the read value of the second time; and the register 91-3 stores the read value of the third time. Each register 91 stores, e.g., a three-bit read value.

Figure 10:
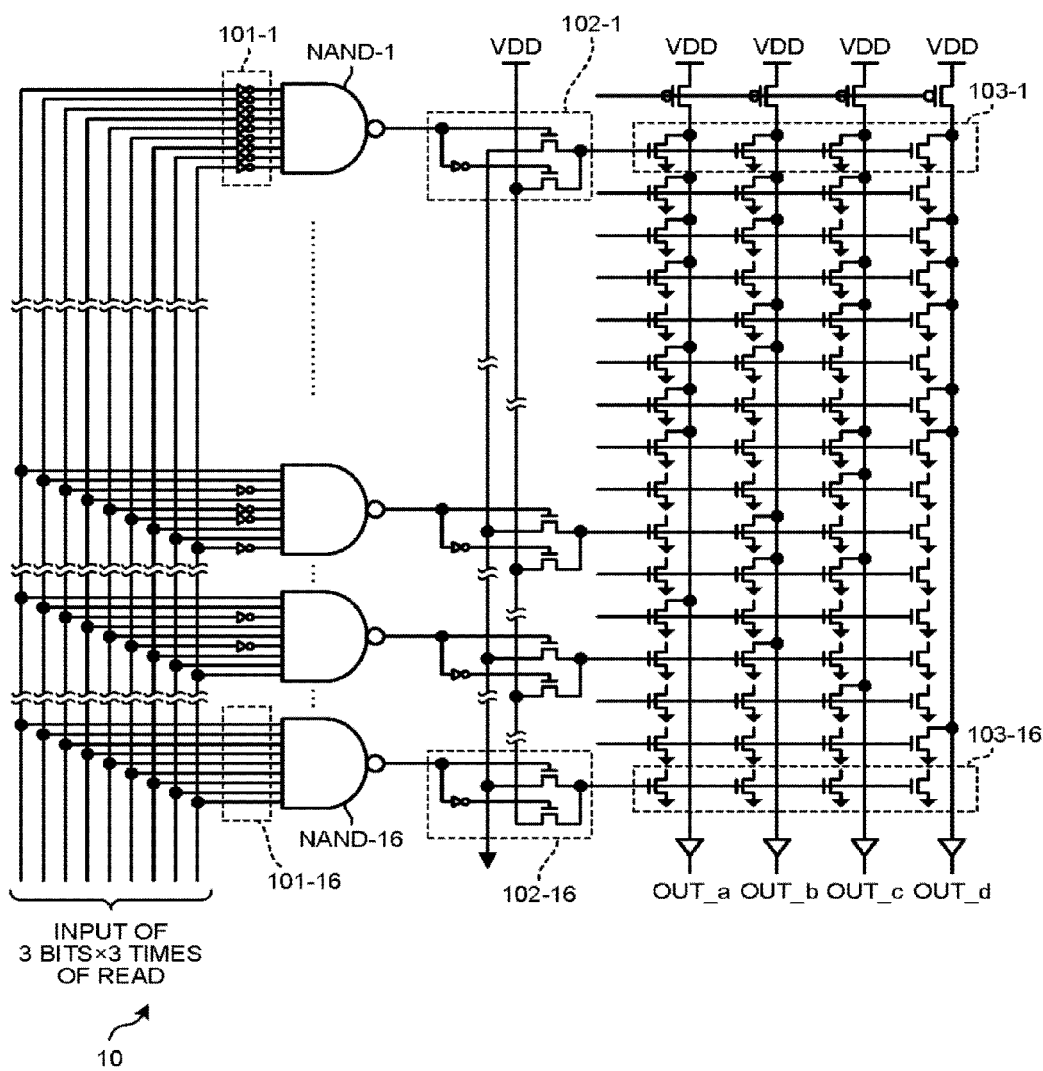
FIG. 10 is a circuit diagram showing the configuration of a data recovery circuit in the embodiment.

When K times of selection operation finish, the data recovery circuit 10 reads the sense results (read values) of K times of selection operation from the hold circuit 9. The data recovery circuit 10 recovers data of (K+1) memory cells based on the results of detecting the signal level K times. The data recovery circuit 10 converts a combination of K times of the signal level into (K+1)-bit data to recover data of (K+1) memory cells MC. For example, where K=3, as shown in FIG. 10, the data recovery circuit 10 converts a combination of three times of the read value (three bits× three times) into four-bit data OUT-a, OUT-b, OUT-c, OUT-d to recover data of four memory cells MC. FIG. 10 is a diagram showing the configuration of the data recovery circuit 10. The data recovery circuit 10 has built therein a logic circuit for recovering data of memory cells MC from three times of the read value as shown in FIG. 9.

Although any way that the read value is represented in bits can be used, for example, as shown in FIG. 11, a read value of "0" can be represented by "000"; a read value of "1" by "100"; a read value of "2" by "110"; and a read value of "3" by "111". In this case, as shown in FIG. 11, the logic circuit of the data recovery circuit 10 receives a combination of three times of the read value (three bits×three times) and converts the combination into four-bit data OUT-a, OUT-b, OUT-c, OUT-d, which corresponds to data of memory cells MC shown in FIG. 9. That is, the logic circuit shown in FIG. 10 is a circuit which realizes logics LG-1 to LG-16 shown in FIG. 11.

For example, the logic circuit corresponding to the logic LG-1 includes an input converter 101-1, a negative AND operator NAND-1, a bias generator 102-1, and a bit generator 103-1. The input converter 101-1 logically inverts the bits of three times of the read value (three bits×three times) to input to the negative AND operator NAND-1. The negative AND operator NAND-1 computes the negative AND of the inputs to output the low (L) level to the bias generator 102-1 if all the bits of three times of the read value are "0" and to output the high (H) level to the bias generator 102-1 if otherwise. If receiving the L level from the negative AND operator NAND-1, the bias generator 102-1 generates a bias of the H level (VDD) to supply to the bit generator 103-1 and, if receiving the H level from the negative AND operator NAND-1, generates a bias of the L level (GND) to supply to the bit generator 103-1. When the bias of the H level is supplied, the bit generator 103-1 is activated to cause all the signal lines of four-bit data OUT-a, OUT-b, OUT-c, OUT-d to be at the L level (bit of 0). When the bias of the L level is supplied, the bit generator 103-1 is deactivated.

For example, the logic circuit corresponding to the logic LG-16 includes an input converter 101-16, a negative AND operator NAND-16, a bias generator 102-16, and a bit generator 103-16. The input converter 101-16 inputs the bits of three times of the read value (three bits×three times), as they are, to the negative AND operator NAND-1. The negative AND operator NAND-16 computes the negative AND of the inputs to output the L level to the bias generator 102-16 if all the bits of three times of the read value are "1" and to output the H level to the bias generator 102-16 if otherwise. If receiving the L level from the negative AND operator NAND-16, the bias generator 102-16 generates a bias of the H level (VDD) to supply to the bit generator 103-16 and, if receiving the H level from the negative AND operator NAND-16, generates a bias of the L level (GND) to supply to the bit generator 103-16. When the bias of the H level is supplied, the bit generator 103-16 is activated to cause all the signal lines of four-bit data OUT-a, OUT-b, OUT-c, OUT-d to be at the H level (bit of 1). When the bias of the L level is supplied, the bit generator 103-1 is deactivated.

The data recovery circuit 10 supplies recovered (K+1)-bit data (e.g., four-bit data) to the data output circuit 82. The data output circuit 82 outputs the (K+1)-bit data as data read from the memory cell array 1 to the outside.

Figure 12:
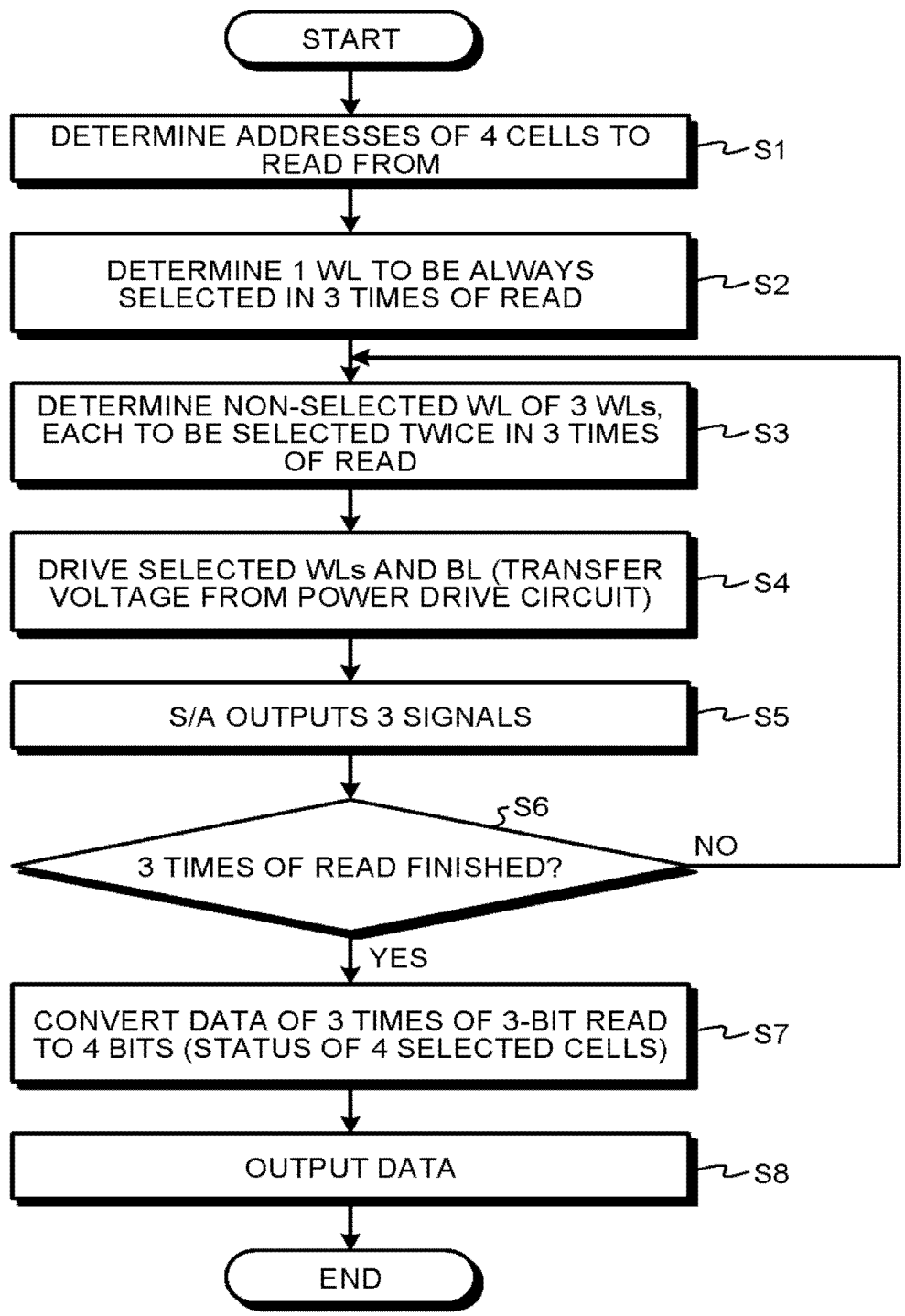
FIG. 12 is a flow chart showing the operation of the semiconductor storage device according to the embodiment.

Next, the operation of the semiconductor storage device 100 will be described using FIG. 12. FIG. 12 is a flow chart showing the operation of the semiconductor storage device 100. Although the case where the number of memory cells as candidates for selection, (K+1)=4, that is, the case where the number of times when selection operation is performed, K=3 will be illustrated below, the same applies to cases where K is another value.

When receiving a request to read data from the outside, the semiconductor storage device 100 determines the addresses of four memory cells MC from which to read in three times of selection operation according to addresses included in the read request (S1). For example, four addresses (p,k), (q,k), (r,k), (s,k) that have the same bit line address (k) are extracted from addresses included in the read request, and the four extracted addresses are determined to be the addresses of four memory cells MC from which to read in three times of selection operation. For example, the addresses of the four memory cells MC(p,k), MC(q,k), MC(r,k), MC(s,k) are determined to be the addresses of four memory cells MC from which to read in three times of selection operation (see FIG. 2).

The semiconductor storage device 100 determines a to-be-selected bit line BL according to the determination at S1. Further, the semiconductor storage device 100 determines a word line WL to be always selected from among four word lines WL as candidates for selection in three times of selection operation (three times of read operation) (S2). For example, the word line WL-p of four word lines WL-p, WL-q, WL-r, WL-s is determined to be the word line WL to be always selected.

The semiconductor storage device 100 determines a word line WL of three word lines WL, each to be selected twice in three times of selection operation (three times of read operation), to be non-selected (S3). For example, for the first time of read operation, the word line WL-s is determined to be non-selected; for the second time of read operation, the word line WL-r is determined to be non-selected; and for the third time of read operation, the word line WL-q is determined to be non-selected.

The semiconductor storage device 100 drives the selected word lines WL and the selected bit line BL according to the determinations at S1 to S3 (S4). That is, in the semiconductor storage device 100, a selecting voltage is supplied from the power drive circuit 7 to the selected word lines WL via the row-related circuit 2 while a selecting voltage is supplied to the selected bit line BL via the column-related circuit 3. Thus, the selected word lines WL are set at the selecting potential with the selected bit line BL being set at the selecting potential, so that a bit line current according to the number of memory cells on the selected bit line BL, which are on, flows through the selected bit line BL.

The semiconductor storage device 100, in this state, detects the level of the signal flowing through the selected bit line BL by the sense amplifier block 32 to output three signals (OUT1, OUT2, OUT3) indicating the detecting result from the sense amplifier block 32 to the hold circuit 9 (S5). The hold circuit 9 holds a three-bit read value (bit representation of the three signals) corresponding to the three signals. In the hold circuit 9, for example, in the first time of read operation, the register 91-1 stores a three-bit read value; in the second time of read operation, the register 91-2 stores a three-bit read value; and in the third time of read operation, the register 91-3 stores a three-bit read value.

The semiconductor storage device 100 determines whether three times of selection operation (three times of read operation) have finished (S6). For example, by referring to the hold circuit 9, the semiconductor storage device 100 can determine whether three times of selection operation (three times of read operation) have finished. If three times of selection operation have not finished (No at S6), the semiconductor storage device 100 lets the process return to S3 and, if three times of selection operation have finished (Yes at S6), lets the process proceed to S7.

The semiconductor storage device 100 converts data of three times of the read value (three bits×three times) into four-bit data OUT-a, OUT-b, OUT-c, OUT-d by the data recovery circuit 10 (S7). Thus, the semiconductor storage device 100 recovers data of the four selected memory cells MC.

The semiconductor storage device 100 outputs the recovered four-bit data to the outside via the data output circuit 82 (S8).

As described above, in the embodiment, in the semiconductor storage device 100, where each memory cell MC of the memory cell array 1 stores binary information (one bit), the column-related circuit 3 is configured to be able to detect the levels of a multi-ary signal. And the row-related circuit 2 determines (K+1) word lines WL to be candidates for selection from among N word lines WL. The row-related circuit 2 performs selection operation to select K word lines WL from among the (K+1) word lines WL as candidates for selection K times while the non-selected word line WL is different for the K times. The column-related circuit 3 detects the level of the current flowing through the selected bit line BL in each of K times of selection operation. The memory bits of (K+1) memory cells MC as candidates for selection can be identified from the sense results of K times of selection operation. That is, the number of read processing times can be reduced to K with respect to the number (K+1) of memory cells from which to read binary information. By implementing tactics in read processing in this way, the number of read processing times can be reduced with respect to the number of memory cells from which to read binary information, and hence the consumption current of the semiconductor storage device 100 can be reduced.

It should be noted that, although the current limiting block 22 shown in FIG. 1 is provided so that the current flowing from the selected memory cell MC, which is on, through the selected word line WL is almost even for each memory cell at the time of current detection by the sense amplifier 321, if each memory cell MC includes a current limiting function, the current limiting block 22 may be omitted.

Figure 13:
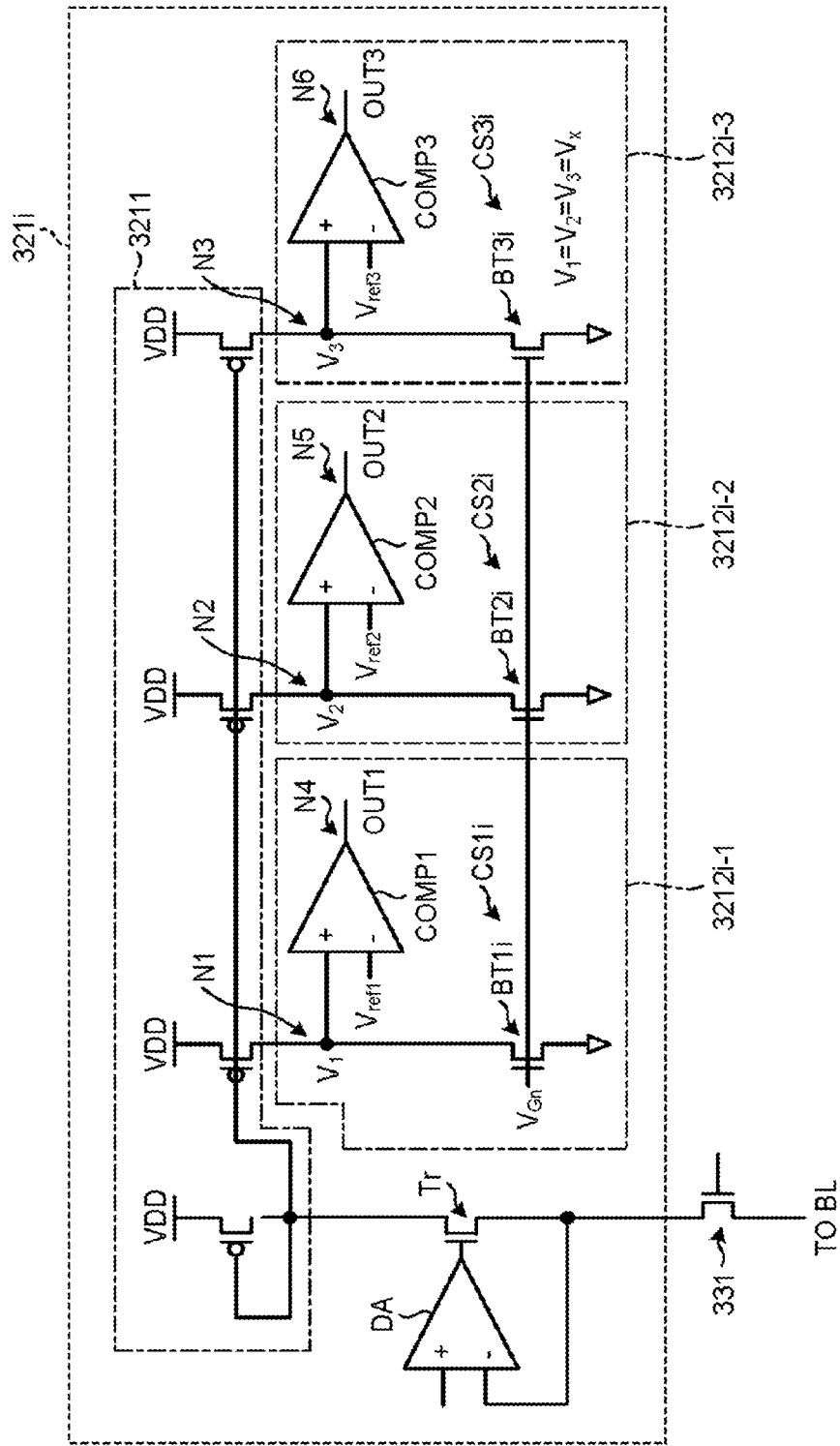
FIG. 13 is a circuit diagram showing the configuration of a sense amplifier in a modified example of the embodiment.

Or in each sense amplifier 321$i$ of the sense amplifier block 32 shown in FIG. 1, K number of detection circuits 3212$i$-1 to 3212$i$-K may be configured to make the drive capabilities of the current sources even so as to make the levels of voltages on charged input nodes even so that, with making comparison reference voltages different, they detect different signal levels. For example, where K=3, the sense amplifier 321$i$ has the configuration shown in FIG. 13. FIG. 13 is a diagram showing the configuration of the sense amplifier 321$i$. Each sense amplifier 321$i$ has a current mirror circuit group 3211 and K detection circuits 3212$i$-1 to 3212$i$-3. The detection circuits 3212$i$-1 to 3212$i$-3 have input nodes N1 to N3, current sources CS1$i$ to CS3$i$, comparators COMP1 to COMP3, and output nodes N4 to N6 respectively. The input nodes N1 to N3 are connected to the current mirror circuit group 3211, and currents $I_{BL1}$, $I_{BL2}$, $I_{BL3}$ flow from the current mirror circuit group 3211 through them. The comparators COMP1 to COMP3 have their non-inverting input terminals connected to the input nodes N1 to N3, reference voltages Vref1 to Vref3 supplied at their inverting input terminals, and their output terminals connected to the output nodes N4 to N6. The current sources CS1$i$ to CS3$i$ are connected between the input nodes N1 to N3 and a reference potential (e.g., ground potential).

The drive capabilities of the current sources CS1$i$ to CS3$i$ are almost even between the three detection circuits 3212$i$-1 to 3212$i$-3, and the levels of reference voltages Vref1 to Vref3 with which the comparators COMP1 to COMP3 compare are different. The current sources CS1$i$ to CS3$i$ have bias transistors BT1$i$ to BT3$i$. For example, the bias transistors BT1$i$ to BT3$i$ have dimensions even for each. The same bias $V_{Gn}$ is supplied to the gates of the bias transistors BT1$i$ to BT3$i$. Thus, since potentials V1 to V3 on the input nodes N1 to N3 in the detection circuits 3212$i$-1 to 3212$i$-3 can become almost even in voltage (read voltage), if the magnitude relation between the reference voltages is given by:

$$Vref1 < Vref2 < Vref3,$$

the levels of the four-ary signal can be detected as shown in FIGS. 14A and 14B. FIG. 14A is a graph showing the sense levels of the sense amplifier 321$i$. FIG. 14B is a diagram showing the operation of the sense amplifier 321$i$.

For example, if a bit of "0" is written into each of the three selected memory cells MC, so that all the three memory cells MC are off, then the level of the read voltage can become smaller than Vref1 shown in FIG. 14A. Thus, all of output signals OUT1 to OUT3 become the low level according to the comparing results of the comparators COMP1 to COMP3 as shown in FIG. 14B. At this time, the value read by the sense amplifier 321$i$ is "0", and its bit representation is "000" which corresponds to (OUT1, OUT2, OUT3)=(low, low, low).

If a bit of "1" is written into one of the three selected memory cells MC, and a bit of "0" is written into the remaining two memory cells MC, so that the one memory cell MC is selectively on, then the level of the read voltage can become greater than or equal to Vref1 and smaller than Vref2 shown in FIG. 14A. Thus, the output signal OUT1 becomes the high level, and the output signals OUT2, OUT3 both become the low level according to the comparing results of the comparators COMP1 to COMP3 as shown in FIG. 14B. At this time, the value read by the sense amplifier 321$i$ is "1", and its bit representation is "100" which corresponds to (OUT1, OUT2, OUT3)=(high, low, low).

If a bit of "1" is written into two of the three selected memory cells MC, and a bit of "0" is written into the remaining one memory cell MC, so that the two memory cells MC are selectively on, then the level of the read voltage can become greater than or equal to Vref2 and smaller than Vref3 shown in FIG. 14A. Thus, the output signals OUT1, OUT2 become the high level, and the output signal OUT3 becomes the low level according to the comparing results of the comparators COMP1 to COMP3 as shown in FIG. 14B. At this time, the value read by the sense amplifier 321$i$ is "2", and its bit representation is "110" which corresponds to (OUT1, OUT2, OUT3)=(high, high, low).

If a bit of "1" is written into each of the three selected memory cells MC, so that all the three memory cells MC are on, then the level of the read voltage can become greater than or equal to Vref3 shown in FIG. 14A. Thus, all the output signals OUT1 to OUT3 become the high level according to the comparing results of the comparators COMP1 to COMP3 as shown in FIG. 14B. At this time, the value read by the sense amplifier 321$i$ is "3", and its bit representation is "111" which corresponds to (OUT1, OUT2, OUT3)=(high, high, high).

Or in the semiconductor storage device 100, when converting read values of K times of selection operation (K times of read operation), that is, a combination of K times of the signal level into (K+1)-bit data to recover data of (K+1) memory cells MC, the data recovery circuit 10 may detect an incorrect combination to perform error processing. For example, if the read values of K times of selection operation (K times of read operation) are a combination of signal levels not recited in FIGS. 9 and 11, then the data recovery circuit 10 may determine that the combination of K times of the signal level is incorrect to stop data recovery processing and to set an error flag. The error flag may be output as a dedicated flag signal to the outside of the semiconductor storage device 100.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
   N word lines, N being an integer of four or greater;
   M bit lines that intersect with the word lines, M being an integer of two or greater;
   multiple memory cells placed at positions where the word lines and the bit lines intersect, the memory cell storing binary data; and
   a read circuit connected to the M bit lines, the read circuit detecting levels of a multi-ary signal,
   wherein the read circuit detects levels of a quarternary signal on a bit line selected from the M bit lines, and
   the semiconductor storage device performs an error operation if data based on the detection results for signal levels is determined to be incorrect.

2. The semiconductor storage device according to claim 1, wherein
   each of the multiple memory cells has a variable resistance element that transitions between a high resistance state and a low resistance state.

3. A semiconductor storage device, comprising:
   N word lines, N being an integer of four or greater;
   M bit lines that intersect with the word lines, M being an integer of two or greater;
   multiple memory cells placed at positions where the word lines and the bit lines intersect, the memory cell storing binary data; and
   a read circuit connected to the M bit lines, the read circuit detects levels of a multi-ary signal, wherein the read circuit has M sense amplifiers corresponding to the M bit lines, and
   wherein each of the sense amplifiers has:
      a current mirror circuit group connected to the bit line; and three detection circuits connected to the current mirror circuit group that detect different signal levels, and
the semiconductor storage device performs an error operation if data based on the detection results for signal levels is determined to be incorrect.

4. The semiconductor storage device according to claim 3, wherein
each of the detection circuits has:
an input node connected to the current mirror circuit group;
a capacitance element electrically connected at one end to the input node and an output node; and
a current source connected to the input node, and
wherein the three detection circuits are different in drive capability of the current source.

5. The semiconductor storage device according to claim 3, wherein
each of the detection circuits has:
an input node connected to the current mirror circuit group;
a current source connected to the input node; and
a comparator that compares the potential on the input node and a reference potential to output the comparing result onto an output node, and
wherein the three detection circuits are equivalent in drive capability of the current source and are supplied with reference potentials of different levels.

6. The semiconductor storage device according to claim 3, wherein
each of the multiple memory cells has a variable resistance element that transitions between a high resistance state and a low resistance state.

7. A semiconductor storage device comprising:
N word lines, N being an integer of four or greater;
M bit lines that intersect with the word lines, M being an integer of two or greater;
multiple memory cells placed at positions where the word lines and the bit lines intersect, the memory cell storing binary data; and
a read circuit connected to the M bit lines, the read circuit detecting levels of a multi-ary signal,
wherein the read circuit detects three times the level of the signal from four memory cells, as candidates for selection, on a bit line selected from the M bit lines, and
the semiconductor storage device performs an error operation if data based on the detection results for signal levels is determined to be incorrect.

8. The semiconductor storage device according to claim 7, further comprising a control circuit that selects three word lines in parallel,
wherein the read circuit detects the level of the signal output from three selected memory cells on the selected bit line with three word lines being selected by the control circuit.

9. The semiconductor storage device according to claim 7, further comprising a control circuit that selects three word lines in parallel,
wherein the control circuit determines four word lines from among the N word lines to be candidates for selection and performs selection operation of three word lines from among the four word lines three times such that a non-selected word line is different for the three times, and
wherein the read circuit detects the level of the signal output from three memory cells selected from among the four memory cells three times while the non-selected memory cell is different for the three times.

10. The semiconductor storage device according to claim 9, wherein
in selection operations of the three times, the control circuit selects one of the four word lines fixedly and selects four word lines from remaining three word lines.

11. The semiconductor storage device according to claim 9, wherein
the control circuit has N decoding circuits corresponding to the N word lines, and
wherein each of the decoding circuits has:
four sub-decoding circuits corresponding to the four word lines as candidates for selection; and
a combining circuit that combines signals output from the four sub-decoding circuits.

12. The semiconductor storage device according to claim 11, wherein
each of the four sub-decoding circuits decodes a combination of address signals and a control signal to decide on the non-selected word line.

13. The semiconductor storage device according to claim 7, further comprising:
a hold circuit that holds detection results for the signal levels of the K times; and
a recovery circuit that recovers data of the four memory cells based on the detection results for signal levels of the three times.

14. The semiconductor storage device according to claim 13, wherein
the recovery circuit converts a combination of the three times of the signal level into four-bit data to recover data of the four memory cells.

15. The semiconductor storage device according to claim 7, wherein
each of the multiple memory cells has a variable resistance element that transitions between a high resistance state and a low resistance state.

16. A control method of a semiconductor storage device which has N word lines, M bit lines that intersect with the word lines, and multiple memory cells placed at positions where the word lines and the bit lines intersect, N being an integer of four or greater, M being an integer of two or greater, the memory cell storing binary data, the control method comprising:
selecting three word lines in parallel from among the N word lines;
detecting a level of a multi-ary signal output from three selected memory cells on one bit line selected from among the M bit lines in a state where the three word lines are selected; and
performing an error operation if data based on the detection results for signal levels is determined to be incorrect.

17. The control method of the semiconductor storage device according to claim 16, wherein
the selecting includes determining four word lines from among the N word lines to be candidates for selection and performing selection operation of three word lines from among the four word lines three times such that a non-selected word line is different for the three times, and
wherein the detecting includes detecting the level of the signal output from three memory cells selected from among the four memory cells three times while the non-selected memory cell is different for the three times.

18. The control method of the semiconductor storage device according to claim 17, wherein
the selecting includes, in selection operations of the three times, selecting one of the four word lines fixedly and selecting two word lines from remaining three word lines.

19. The control method of the semiconductor storage device according to claim 18, further comprising:
holding detection results for signal levels of the three times; and
recovering data of the four memory cells based on the detection results for signal levels of the three times.

20. The semiconductor storage device according to claim 16, wherein
each of the multiple memory cells has a variable resistance element that transitions between a high resistance state and a low resistance state.

* * * * *